(12) United States Patent
Chen (10) Patent No.: US 10,096,567 B2
(45) Date of Patent: Oct. 9, 2018

(54) PACKAGE SUBSTRATE AND PACKAGE (71) Applicant: Winbond Electronics Corp., Taichung (TW)

(72) Inventor: Yu-Ming Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/922,900

(22) Filed: Mar. 15, 2018

(65) Prior Publication Data
US 2018/0204817 A1    Jul. 19, 2018

Related U.S. Application Data (62) Division of application No. 15/489,744, filed on Apr. 18, 2017, now Pat. No. 9,991,222.

(30) Foreign Application Priority Data

Jul. 27, 2016 (CN) .......................... 2016 1 0602262

(51) Int. Cl.
*H01L 23/00* (2006.01)
*H01L 23/31* (2006.01)

(52) U.S. Cl.
CPC .......... *H01L 24/45* (2013.01); *H01L 23/3128* (2013.01); *H01L 24/27* (2013.01); *H01L 24/29* (2013.01); *H01L 24/43* (2013.01); *H01L 2224/3001* (2013.01); *H01L 2224/48091* (2013.01)

(58) Field of Classification Search
CPC ......... H01L 24/27; H01L 24/29; H01L 24/43; H01L 24/45; H01L 23/3128; H01L 2224/3001; H01L 2224/48091
See application file for complete search history.

(56) References Cited

U.S. PATENT DOCUMENTS

| 2012/0256796 A1* | 10/2012 | Leiba | .................... H01Q 1/2283 343/702 |
| 2015/0201500 A1* | 7/2015 | Shinar | .................... H05K 3/125 425/132 |
| 2016/0293554 A1* | 10/2016 | Tan | ...................... H01L 23/5385 |
| 2016/0315034 A1* | 10/2016 | Ziglioli | .................. H01L 24/48 |

FOREIGN PATENT DOCUMENTS

TW    201438192    10/2014

OTHER PUBLICATIONS

"Office Action of Taiwan Counterpart Application," dated Feb. 5, 2018, p. 1-p. 6.

* cited by examiner

Primary Examiner — Yosef Gebreyesus
(74) Attorney, Agent, or Firm — JCIPRNET (57) ABSTRACT A package substrate including a carrier, a first patterned conductive layer, a second patterned conductive layer and a 3D-printing conductive wire is provided. The carrier has a first surface, a second surface and a third surface. The first surface is opposite to the second surface, and the third surface is connected between the first surface and the second surface. The first patterned conductive layer is disposed on the first surface. The second patterned conductive layer is disposed on the second surface. The 3D-printing conductive wire is disposed on the third surface and connected between the first patterned conductive layer and the second patterned conductive layer.

10 Claims, 7 Drawing Sheets

PACKAGE SUBSTRATE AND PACKAGE

CROSS-REFERENCE TO RELATED APPLICATION

This application is a divisional application of U.S. application Ser. No. 15/489,744, filed on Apr. 18, 2017, now allowed. The prior U.S. application Ser. No. 15/489,744 claims the priority benefit of China application serial no. 201610602262.4, filed on Jul. 27, 2016. The entirety of each of the above-mentioned patent applications is hereby incorporated by reference herein and made a part of this specification.

BACKGROUND

Field of the Invention

The invention relates to a package substrate and a package. More particularly, the invention relates to a package substrate manufactured by using a three-dimensional (3D) printing technique and a package.

Description of Related Art

In a package process of a semiconductor device, a wire frame of the related art is usually restricted by a single-layer structure and manufacturing requirements of the wire frame from unlimitedly designing a circuit of the wire frame.

Additionally, for semiconductor package using a substrate designed with wire winding, conductive vias have to be configured on the substrate for connecting circuits of different layers. A via is generally formed by processing on the substrate using a computer numerical control (CNC) machine or laser, which requires several processes, such as thinning, drilling, rubbing, depositing, electroplating, filling and so on, for implementing mutual connection of wires. The aforementioned manufacturing method disadvantages in not only its complexity, but also material consumption and affection to the environment.

SUMMARY

The invention provides a package substrate, including a carrier, a first patterned conductive layer, a second patterned conductive layer and a three-dimensional (3D) printing conductive wire. The carrier has a first surface, a second surface and a third surface. The first surface is opposite to the second surface, and the third surface is connected between the first surface and the second surface. The first patterned conductive layer is disposed on the first surface. The second patterned conductive layer is disposed on the second surface. The 3D-printing conductive wire is disposed on the third surface and connected between the first patterned conductive layer and the second patterned conductive layer.

The invention provides a package including a package substrate and a first electronic device. The package substrate includes a carrier, a first patterned conductive layer, a second patterned conductive layer and a 3D-printing conductive wire. The carrier has a first surface, a second surface and a third surface. The first surface is opposite to the second surface, and the third surface is connected between the first surface and the second surface. The first patterned conductive layer is disposed on the first surface. The second patterned conductive layer is disposed on the second surface. The 3D-printing conductive wire is disposed on the third surface and connected between the first patterned conductive layer and the second patterned conductive layer. The first electronic device is disposed on the first surface and electrically connected with the first patterned conductive layer.

To sum up, in the package substrate and the manufacturing method thereof of the invention, because the 3D-printing technique features in being capable of printing on a 3D surface, the 3D-printing conductive wire can be printed on the third surface of the carrier by the 3D-printing method. Thereby, wires on the first patterned conductive layer and the second patterned conductive layer can be mutually connected in an easy way, without using the via process, and a shape of the substrate can further be designed for packaging according to performance requirements of a package product. Moreover, the manufacturing method of the package substrate can contribute to reducing production complexity and required consumables, and thus can effectively reduce the time and cost spent on manufacturing the package substrate. Additionally, the package provided by the invention can achieve better design flexibility because of the use of the package substrate.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
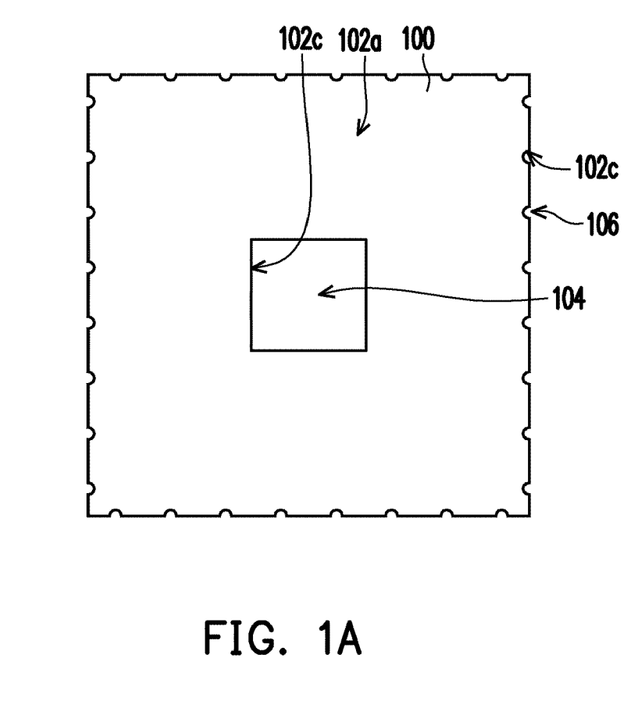
FIGS. 1A, 2A, and 3A are top views of a manufacturing process of a package substrate according to an embodiment of the invention.
Figure 1B:
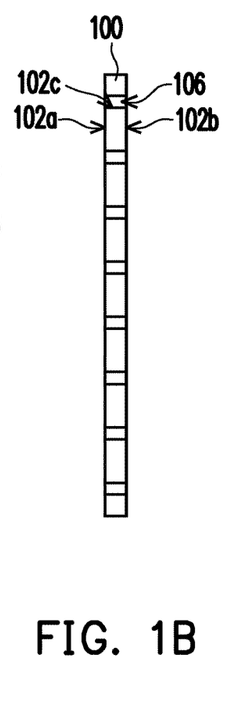
FIGS. 1B, 2B and 3B are right-side views of FIGS. 1A, 2A and 3A, respectively.
Figure 1C:
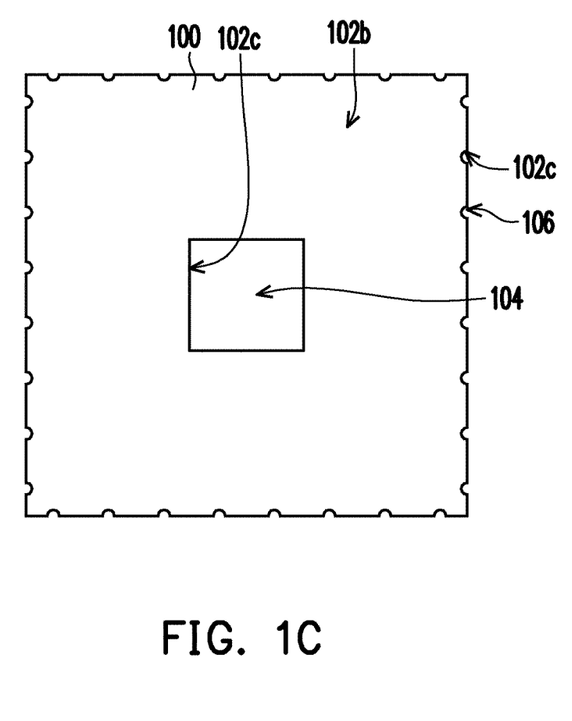
FIGS. 1C, 2C and 3C are bottom views of FIGS. 1A, 2A and 3A, respectively.
Figure 2A:
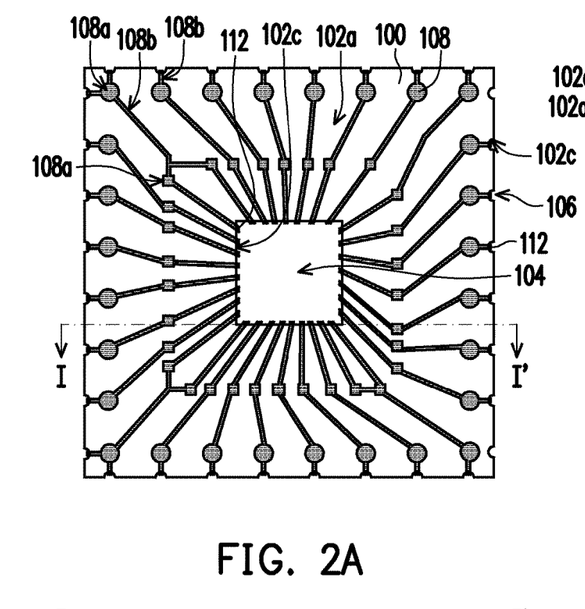
Figure 2B:
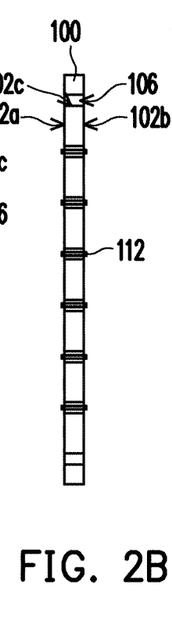
Figure 2C:
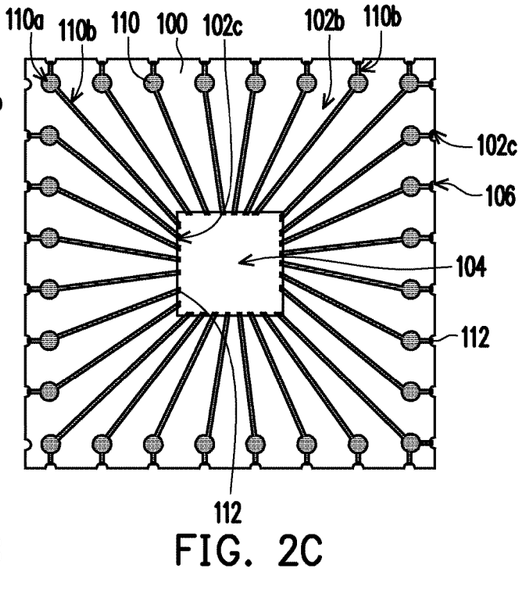
Figure 2D:
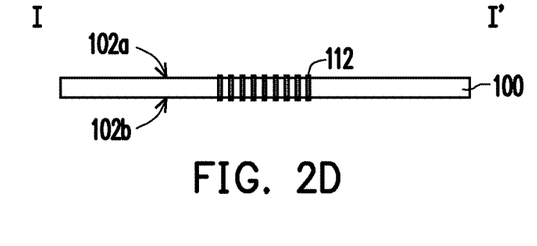
FIG. 2D is a cross-sectional view of a junction of a three-dimensional (3D) printing conductive wire and a carrier along a section line I-I' in FIG. 2A.
Figures 3A, 3B, 3D:
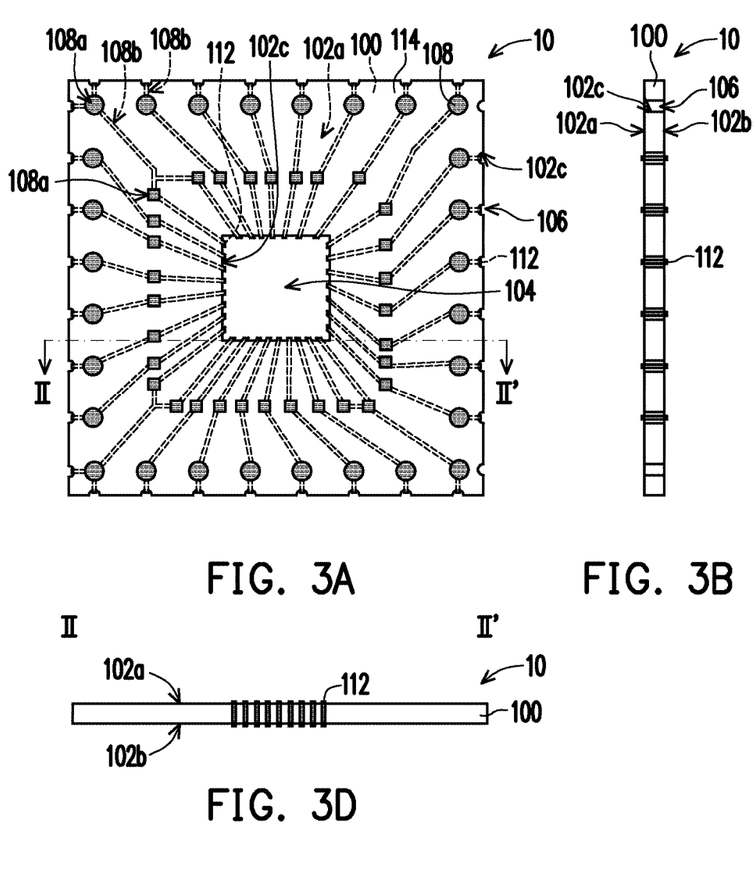
FIG. 3D is a cross-sectional view of a junction of a 3D-printing conductive wire and a carrier along a section line II-II' in FIG. 3A.
Figure 3C:
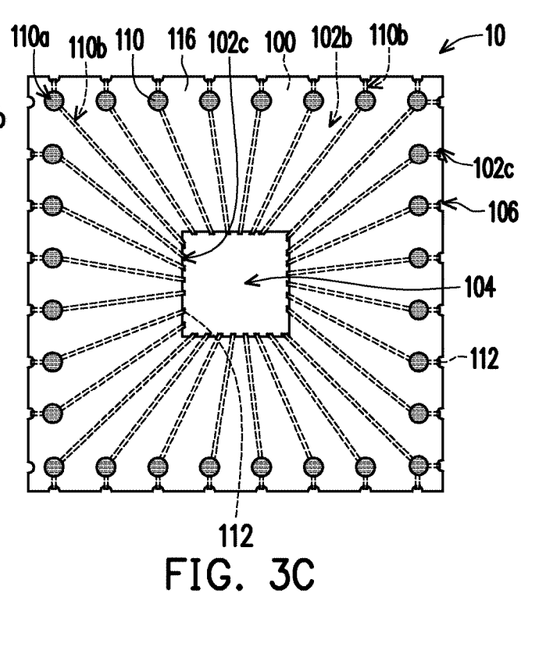

FIGS. 1A, 2A, and 3A are top views of a manufacturing process of a package substrate according to an embodiment of the invention. FIGS. 1B, 2B and 3B are right-side views of FIGS. 1A, 2A and 3A, respectively. FIGS. 1C, 2C and 3C are bottom views of FIGS. 1A, 2A and 3A, respectively. FIG. 2D is a cross-sectional view of a junction of a three-dimensional (3D) printing conductive wire and a carrier along a section line I-I' in FIG. 2A. FIG. 3D is a cross-sectional view of a junction of a 3D-printing conductive wire and a carrier along a section line II-II' in FIG. 3A. For clear description, parts disposed on a first and a second surfaces of a carrier are omitted in FIGS. 1B, 2B and 3B, and only a 3D-printing conductive wire and a carrier are illustrated in FIGS. 2D and 3D.

Referring to FIGS. 1A to 1C, a carrier 100 is provided. A material of the carrier 100 may be determined according to packaging requirements of a package. For example, a material of the carrier 100 may include plastic, ceramics or glass for providing a variety of package shapes and may be used for packaging various semiconductor devices. The carrier 100 has a first surface 102a, a second surface 102b and a third surface 102c. The first surface 102a is opposite to the second surface 102b, and the third surface 102c is connected between the first surface 102a and the second surface 102b.

Additionally, the carrier 100 may selectively have an opening 104 disposed in the carrier 100 or at least one notch 106 disposed at an edge of the carrier 100. A method of forming the notches 104 and 106 may be, for example, directly formed by mechanically drilling, laser drilling or injection molding. The number of the notches 106 of FIGS. 1A and 1C is illustrated as an example, but the invention is not limited thereto.

The third surface 102c may include a surface of the opening 104 in the carrier 100, a side surface of the edge of carrier 100 or a surface of the notch 106 of the edge of carrier 100, but the invention is not limited thereto. As long as the third surface 102c is a surface connected between the first surface 102a and the second surface 102b, it pertains to the scope of the invention. In the present embodiment, the third surface 102c including the surface of the opening 104 in the carrier 100 and the surface of the notch 106 of the edge of carrier 100 is illustrated as an example.

Referring to FIGS. 2A to 2D, a patterned conductive layer 108 is formed on the first surface 102a. The patterned conductive layer 108 may include contacts 108a and conductive wires 108b. The contacts 108a are connected with the conductive wires 108b. A material of the patterned conductive layer 108 may include a conductive material, such as copper, silver, gold or a conductive polymer, and a method of forming the patterned conductive material 108 may include printing a conductive material, such as a copper paste, a silver paste, a gold paste or a conductive polymer, on the first surface 102a through 3D-printing, screen printing, inkjet printing, intaglio printing, flexography printing or planographic printing. The method of forming the patterned conductive layer 108 may further include performing a baking process on the conductive material printed on the first surface 102a. A temperature of the baking process ranges, for example, from 80° C. to 260° C.

A patterned conductive layer 110 is formed on the second surface 102b. The patterned conductive layer 110 may include contacts 110a and conductive wires 110b. The contacts 110a are connected with the conductive wires 110b. A material of the patterned conductive layer 110 may include a conductive material, such as copper, silver, gold or a conductive polymer, and a method of forming the patterned conductive material 110 includes printing a conductive material, such as a copper paste, a silver paste, a gold paste or a conductive polymer, on the second surface 102b through 3D-printing, screen printing, inkjet printing, intaglio printing, flexography printing or planographic printing. The method of forming the patterned conductive layer 110 may further include performing the baking process on the conductive material printed on the second surface 102b. A temperature of the baking process ranges, for example, from 80° C. to 260° C.

A 3D-printing conductive wire 112 is formed on the third surface 102c by a 3D-printing method. In the present embodiment, the 3D-printing conductive wire 110 may be formed on the surface of the opening 104 and the surface of the notch 106. The 3D-printing conductive wire 112 is connected between the patterned conductive layer 108 and the patterned conductive layer 110. Specifically, the patterned conductive layer 108 may be electrically connected with the patterned conductive layer 110 through the conductive wire 108b, the 3D-printing conductive wire 112 and the conductive wire 110b. A material of the 3D-printing conductive wire 112 may include a conductive material, such as copper, silver, gold or a conductive polymer, and a method of forming the 3D-printing conductive wire 112 may include printing a conductive material, such as a copper paste, a silver paste, a gold paste or a conductive polymer, on the third surface 102c through 3D-printing. The method of forming the 3D-printing conductive wire 112 may further include performing the baking process on the conductive material printed on the third surface 102c. A temperature of the baking process ranges, for example, from 80° C. to 260° C.

In the present embodiment, the 3D-printing conductive wire 112 achieves being connected between the patterned conductive layers 108 and 110 by the 3D-printing conductive wire 112 protruding from the first surface 102a and the second surface 102b, but the invention is not limited thereto. In another embodiment, the 3D-printing conductive wire 112 may also achieve being connected between the patterned conductive layers 108 and 110 by the conductive wire 108b of the patterned conductive layer 108 protruding from the first surface 102a and the conductive wire 110b of the patterned conductive layer 110 protruding from the second surface 102b. Persons ordinarily skilled in the art may adjust the manner of connecting the 3D-printing conductive wire 112 between the patterned conductive layer 108 and the patterned conductive layer 110 according to process requirements.

Additionally, the patterned conductive layer 108, the patterned conductive layer 110 and the 3D-printing conductive wire 112 may be separately or simultaneously formed. Namely, a sequence of forming the patterned conductive layer 108, the patterned conductive layer 110 and the 3D-printing conductive wire 112 may depend on the process requirements.

Referring to FIGS. 3A to 3D, a solder resist layer 114 may be selectively formed on the first surface 102a for protecting the patterned conductive layer 108 on the first surface 102a. The solder resist layer 114 covers the patterned conductive layer 108 and exposes a portion of the patterned conductive layer 108. For example, the solder resist layer 114 may expose the contact 108a of the patterned conductive layer 108. Additionally, the solder resist layer 114 may further cover a top surface of the 3D-printing conductive wire 112. A material of the solder resist layer 114 is, for example, an insulation material, and a forming method thereof includes, for example, 3D-printing, screen printing, inkjet printing, intaglio printing, flexography printing, planographic printing or irradiating a photosensitive insulation material by using UV light and then patterning it.

Additionally, a solder resist layer 116 may be selectively formed on the second surface 102b for protecting the patterned conductive layer 110 on the second surface 102b. The solder resist layer 116 covers the patterned conductive layer 110 and exposes a portion of the patterned conductive layer 110. For example, the solder resist layer 116 may expose the contact 110a of the patterned conductive layer 110. Additionally, the solder resist layer 116 may further cover a bottom surface of the 3D-printing conductive wire 112. A material of the solder resist layer 116 is, for example, an insulation material, and a forming method thereof includes, for example, 3D-printing, screen printing, inkjet printing, intaglio printing, flexography printing, planographic printing or irradiating a photosensitive insulation material by using UV light and then patterning it. Additionally, the solder resist layer 114 and the solder resist layer 116 may be separately or simultaneously formed. Namely, a sequence of forming the solder resist layer 114 and the solder resist layer 116 may depend on the process requirements.

In the present embodiment, since the 3D-printing conductive wire 112 is formed in the opening 104 and the notch 106, thus the 3D-printing conductive wire 112 is not easily damaged by an external force even though a solder resist layer covering the 3D-printing conductive wire 112 is not formed on the third surface 102c. Additionally, the absence of the solder resist layer covering the 3D-printing conductive wire 112 on the surface of the notch 106 is beneficial for performing an electrical test in a subsequent process. In another embodiment, a solder resist layer covering the 3D-printing conductive wire 112 may also be formed on the third surface 102c.

Hereinafter, the package substrate of the present embodiment will be described with reference to FIGS. 3A to 3D. Additionally, even though a manufacturing method of the package substrate of the present embodiment has been described by taking the manufactured method above as an example, the manufacturing method of the package substrate of the invention is not limited thereto. Referring to FIGS. 3A to 3D, a package substrate 10 includes the carrier 100, the patterned conductive layer 108, the patterned conductive layer 110 and the 3D-printing conductive wire 112. The carrier 100 has the first surface 102a, the second surface 102b and the third surface 102c. The first surface 102a is opposite to the second surface 102b, and the third surface 102c is connected between the first surface 102a and the second surface 102b. The patterned conductive layer 108 is disposed on the first surface 102a. The patterned conductive layer 110 is disposed on the second surface 102b. The 3D-printing conductive wire 112 is disposed on the third surface 102c and connected between the patterned conductive layer 108 and the patterned conductive layer 110. Additionally, the package substrate 10 may further include the solder resist layer 114 and the solder resist layer 116. The solder resist layer 114 covers the patterned conductive layer 108 and exposes a portion of the patterned conductive layer 108. The solder resist layer 116 covers the patterned conductive layer 110 and exposes a portion of the patterned conductive layer 110. In addition, the materials, dispositions, forming methods and functions of the parts of the package substrate 10 have been described in the manufacturing method with reference to FIGS. 1A through 3D above, and thus will not repeated hereinafter.

According to the above embodiment, in the package substrate 10 and the manufacturing method thereof, the 3D-printing technique features in being capable of printing on a 3D surface, and thus, the 3D-printing conductive wire 112 can be printed on the third surface 102c of the carrier 100 by the 3D-printing method. Therefore, the wires on the patterned conductive layers 108 and 110 can be mutually connected in an easy way, without using any via process, and a shape of the substrate can be designed for packaging according to performance requirements of a package product. Moreover, the manufacturing method of the package substrate 10 can contribute to effectively reducing production complexity and required consumables, and thus can effectively reduce the time and cost spent on manufacturing the package substrate 10.

Figures 4A, 4B:
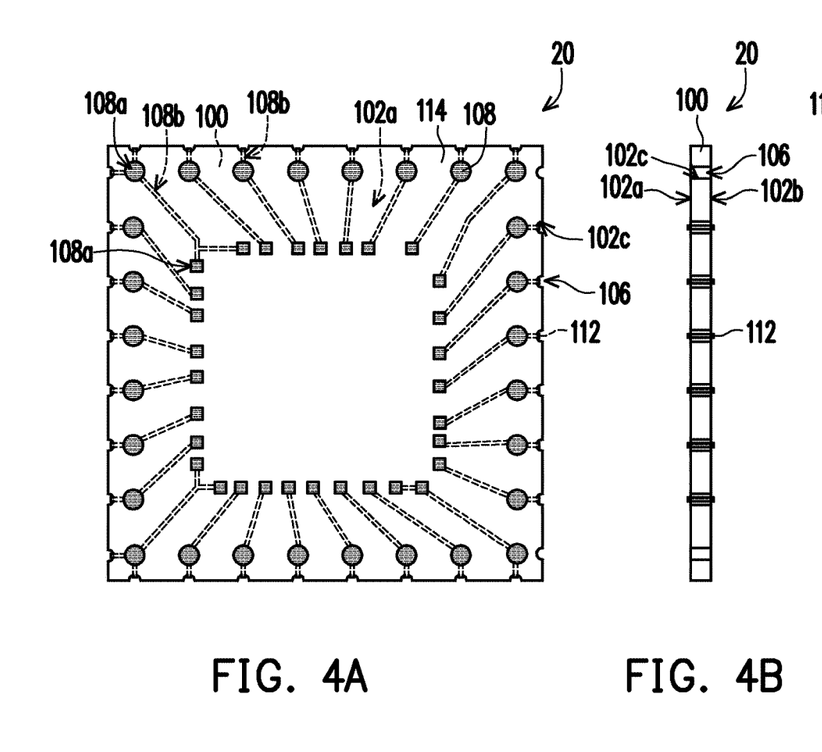
FIG. 4A is a top view of a package substrate according to another embodiment of the invention.
FIG. 4B is a right-side view of FIG. 4A.
Figure 4C:
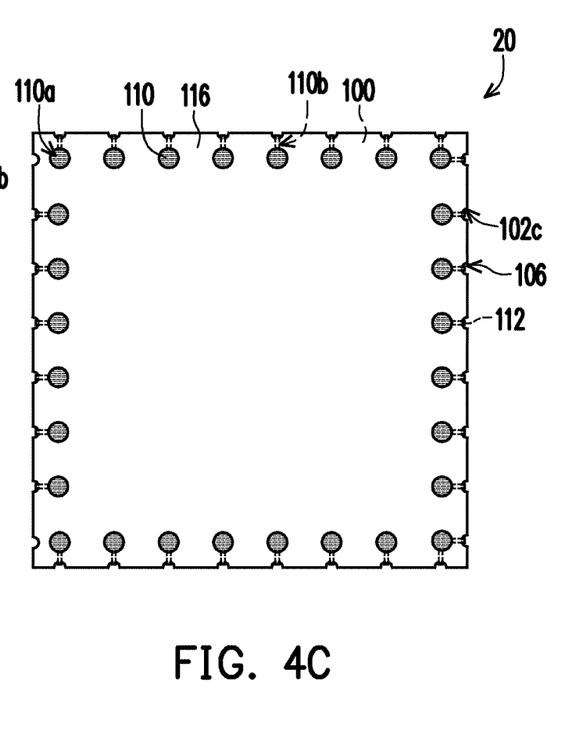
FIG. 4C is a bottom view of FIG. 4A.

FIG. 4A is a top view of a package substrate according to another embodiment of the invention. FIG. 4B is a right-side view of FIG. 4A. For clear description, parts disposed on a first and a second surfaces of a carrier are omitted in FIG. 4B. FIG. 4C is a bottom view of FIG. 4A. Referring to FIGS. 3A to 3D and FIGS. 4A to 4C simultaneously, a difference between a package substrate 20 and the package substrate 10 will be described as below. The package substrate 20 employs only the surface of the notch 106 as the third surface 102c. Namely, the carrier 100 of the package substrate 20 does not have the opening 104 nor the 3D-printing conductive wire 112 on the surface of the opening 104. In the package substrate 20, the patterned conductive layer 108 is connected with the patterned conductive layer 110 through the 3D-printing conductive wire 112 disposed on the surface of the notch 106. Additionally, the same parts of the package substrate 20 and the package substrate 10 are labeled by the same reference numerals, and thus will not be repeated.

Figures 5A, 5B:
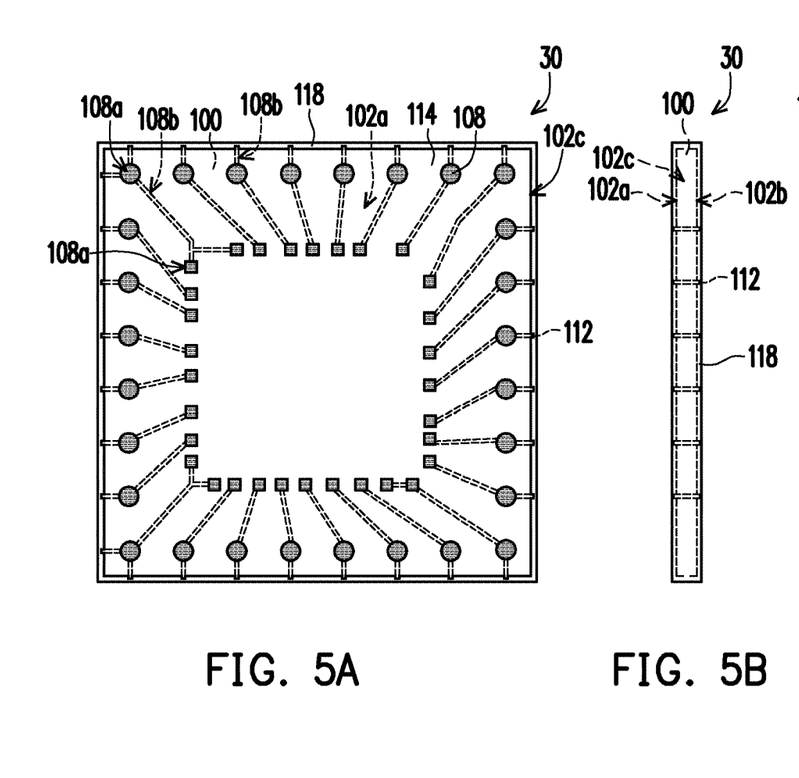
FIG. 5A is a top view of a package substrate according to another embodiment of the invention.
FIG. 5B is a right-side view of FIG. 5A.
Figure 5C:
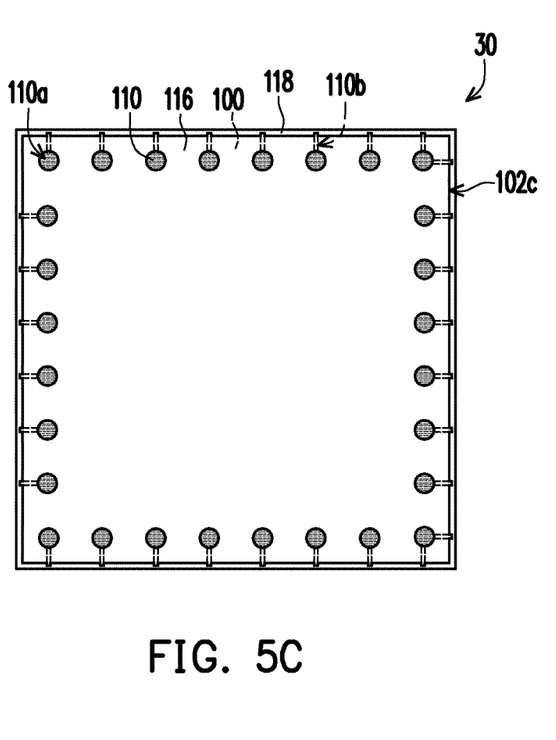
FIG. 5C is a bottom view of FIG. 5A.

FIG. 5A is a top view of a package substrate according to another embodiment of the invention. FIG. 5B is a right-side view of FIG. 5A. For clear description, parts disposed on a first and a second surfaces of a carrier are omitted in FIG. 5B. FIG. 5C is a bottom view of FIG. 5A. Referring to FIGS. 4A to 5C simultaneously, a difference between a package substrate 30 and the package substrate 20 will be described as below. The carrier 100 of the package substrate 30 does not have the notch 106. The package substrate 30 employs only the side surface of the edge of the carrier 100 as the third surface 102c. Namely, the 3D-printing conductive wire 112 is disposed on the side surface of the edge of the carrier 100. In the package substrate 30, the patterned conductive layer 108 is connected with the patterned conductive layer 110 through the 3D-printing conductive wire 112 disposed on the side surface of the edge of the carrier 100. Additionally, a solder resist layer 118 covering the 3D-printing conductive wire 112 may be selectively formed on the third surface 102c for protecting the 3D-printing conductive wire 112 on the third surface 102c. Additionally, the same parts of the package substrate 30 and the package substrate 20 are labeled by the same reference numerals, and thus will not be repeated.

Figure 6A:
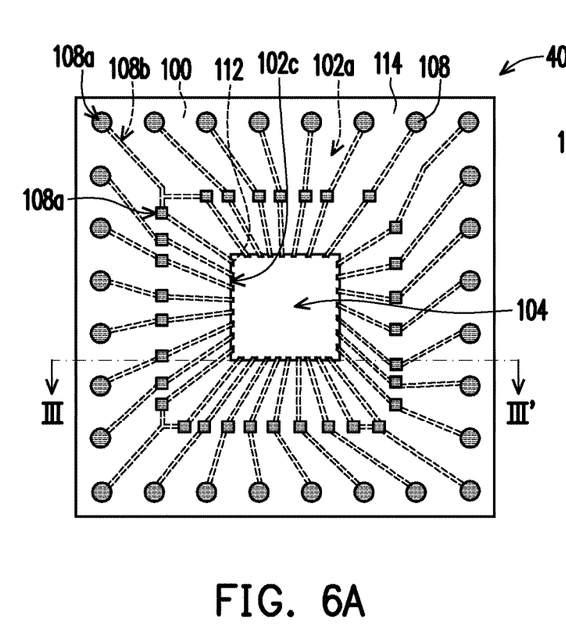
FIG. 6A is a top view of a package substrate according to another embodiment of the invention.
Figure 6B:
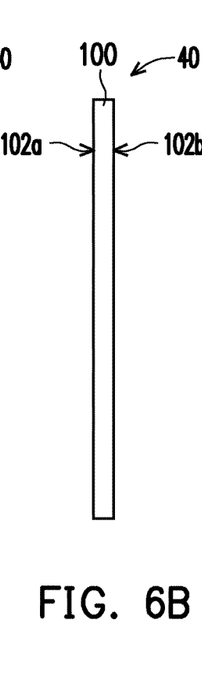
FIG. 6B is a right-side view of FIG. 6A.
Figure 6C:
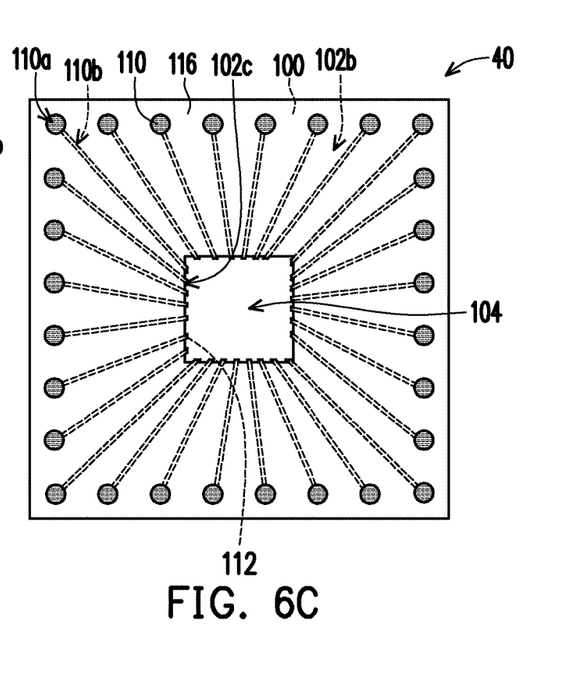
FIG. 6C is a bottom view of FIG. 6A.
Figure 6D:
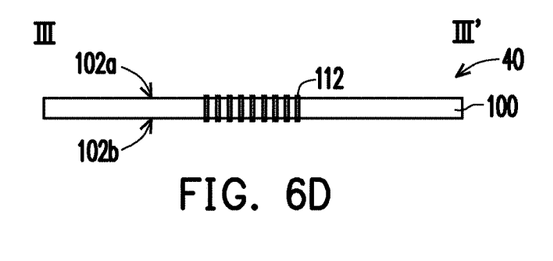
FIG. 6D is a cross-sectional view of a junction of a 3D-printing conductive wire and a carrier along a section line in FIG. 6A.

FIG. 6A is a top view of a package substrate according to another embodiment of the invention. FIG. 6B is a right-side view of FIG. 6A. FIG. 6C is a bottom view of FIG. 6A. FIG. 6D is a cross-sectional view of a junction of a 3D-printing conductive wire and a carrier along a section line in FIG. 6A. For clear description, parts disposed on a first and a second surfaces of a carrier are omitted in FIG. 6B, and only a 3D-printing conductive wire and the carrier are illustrated in FIG. 6D.

Referring to FIGS. 3A to 3D and FIGS. 6A to 6D simultaneously, a difference between a package substrate 40 and the package substrate 10 will be described as below. The package substrate 40 employs only the surface of the opening 104 as the third surface 102c. Namely, the carrier 100 of the package substrate 40 does not have the notch 106 nor the 3D-printing conductive wire 112 disposed on the surface of the notch 106. In the package substrate 40, the patterned conductive layer 108 is connected with the patterned conductive layer 110 through the 3D-printing conductive wire 112 disposed on the surface of the opening 104. Additionally, the same parts of the substrate 40 and the package substrate 10 are labeled by the same reference numerals, and thus will not be repeated.

The package substrate 10, 20, 30 or 40 may be applied to a package process performed using a die bond or a flip-chip bond technique. Additionally, the package substrate 10, 20, 30 or 40 may be applied to a single-chip package, a dual-die package or a package on package (PoP) process.

Then, an embodiment is provided below as an example to illustrate a package of the invention.

Figure 7:
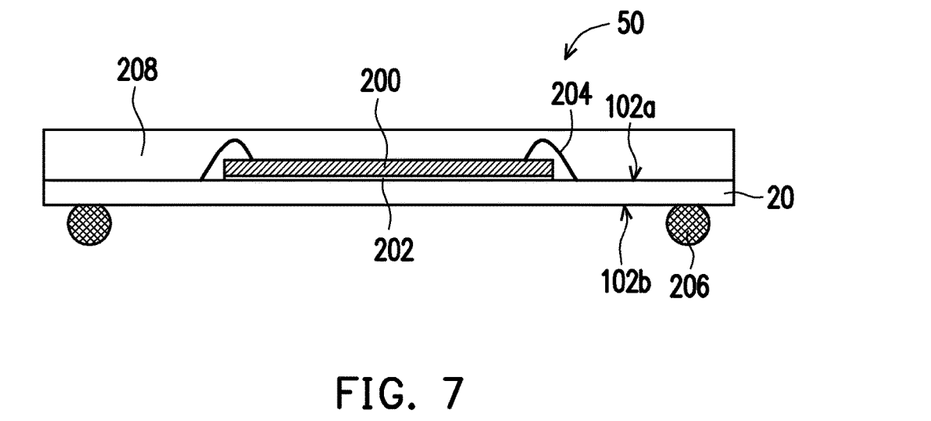
FIG. 7 is a cross-sectional view of a package according to an embodiment of the invention.

FIG. 7 is a cross-sectional view of a package according to an embodiment of the invention. Referring to FIGS. 4A to 4C and FIG. 7, a package 50 includes a package substrate 20 and a first electronic device 200. The structure of the package substrate 20 has been described in detail according to the embodiments above, and thus will not be repeated. In the present embodiment, the package 50 manufactured by using the package substrate 20 of FIGS. 4A to 4C is taken as an example for illustration, but the invention is not limited thereto. In another embodiment, the package 50 may also be manufactured by using the package substrate 30 illustrated in FIGS. 5A to 5C.

The first electronic device 200 is disposed on the first surface 102a of the package substrate 20 and electrically connected with the patterned conductive layer 108 (illustrated in FIG. 4A) of the package substrate 20. The first electronic device 200 is, for example, a chip, but the invention is not limited thereto. The first electronic device 200 may be adhered to the first surface 102a of the package substrate 20 through an adhesive 202. The first electronic device 200 may be electrically connected with the patterned conductive layer 108 of the package substrate 20 through a bonding wire 204.

Additionally, the package 50 may further include solder balls 206. The solder balls 206 are disposed on the second surface 102b of the substrate 20 and electrically connected with the patterned conductive layer 110 (illustrated in FIG. 4C) of the package substrate 20. The first electronic device 200 may be electrically connected with the solder balls 206 through the patterned conductive layer 108, the 3D-printing conductive wire 112 and the patterned conductive layer 110 (illustrated in FIGS. 4A through 4C) of the package substrate 20.

Additionally, the package 50 may further include an encapsulant 208. The encapsulant 208 encapsulates the first electronic device 200 for protecting the first electronic device 200. A material of the encapsulant 208 is, for example, a dielectric polymer material.

Figure 8:
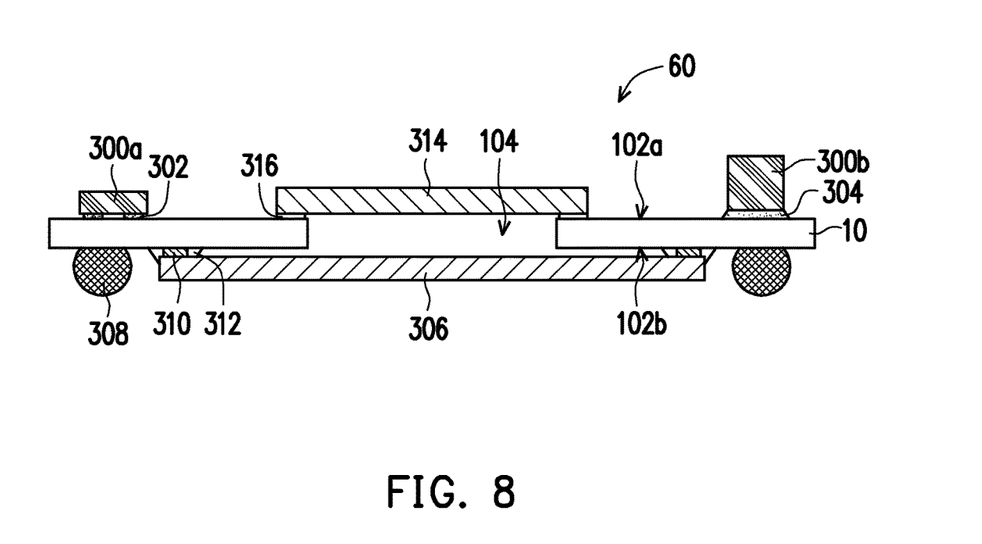
FIG. 8 is a cross-sectional view of a package according to another embodiment of the invention.

FIG. 8 is a cross-sectional view of a package according to another embodiment of the invention. Referring to FIGS. 3A to 3D and FIG. 8, a package 60 includes a package substrate 10 and first electronic devices 300a and 300b. The structure of the package substrate 10 has been described in detail according to the embodiments above, and thus will not be repeated. In the present embodiment, the package 60 manufactured by using the package substrate 10 of FIGS. 3A to 3D is taken as an example for illustration, but the invention is not limited thereto. In another embodiment, the package 60 may also be manufactured by using the package substrate 40 illustrated in FIGS. 6A to 6D.

The first electronic devices 300a and 300b are disposed on the first surface 102a of the package substrate 10 and electrically connected with the patterned conductive layer 108 (illustrated in FIG. 3A) of the package substrate 10, respectively. The first electronic device 300a is, for example, a driver IC, and the first electronic device 300b is, for example, a passive device but the invention is not limited thereto. The first electronic device 300a may be electrically connected with the patterned conductive layer 108 of the package substrate 10 through a bump 302. The first electronic device 300b may be assembled to the first surface 102a of the package substrate 10 through a surface mount technology (SMT). The first electronic device 300b may be electrically connected with the patterned conductive layer 108 of the package substrate 10 through a conductive glue 304.

Additionally, the package 60 may further include at least one of a second electronic device 306 and solder balls 308. The second electronic device 306 and the solder balls 308 are disposed on the second surface 102b of the package substrate 10 and electrically connected with the patterned conductive layer 110 (illustrated in FIG. 3C) of the package substrate 10, respectively. The opening 104 of the package substrate 10 exposes the second electronic device 306 disposed on the second surface 102b. The second electronic device 306 is, for example, an image sensor, but the invention is not limited thereto. The second electronic device 306 may be electrically connected with the patterned conductive layer 110 of the package substrate 10 through the bump 310, and the bump 310 may be protected by an underfill 312. The first electronic devices 300a and 300b may be electrically connected with second electronic device 306 and/or the solder balls 308 through the patterned conductive layer 108, the 3D-printing conductive wire 112 and the patterned conductive layer 110 (illustrated in FIGS. 3A through 3D) of the package substrate 10 respectively.

Additionally, the package 60 may further include a light-transmitting plate 314, and a light may pass through the light-transmitting plate 314 to reach the second electronic device 306. The light-transmitting plate 314 is disposed on the first surface 102a of the package substrate 10 and covers the opening 104. A material of the light-transmitting plate 314 is, for example, glass. The light-transmitting plate 314 may be adhered to the first surface 102a of the package substrate 10 through the adhesive 316.

According to the above embodiment, manufacturing the package 50 or 60 by using the package substrate 10, 20, 30 or 40 can achieve better design flexibility of the packages 50 and 60.

Based on the above, in the package substrate and the manufacturing method thereof provided by the above embodiments, wires on the patterned conductive layers can be mutually connected in an easy way, without using any via process, and the shape of the substrate can further be designed for packaging according to performance requirements of a package product. Moreover, the manufacturing method of the package substrate can contribute to effectively reducing the time and cost spent on manufacturing the package substrate. Additionally, the package of the above described embodiments can achieve better design flexibility due to the use of the package substrate.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A package substrate, comprising:
   a carrier, having a first surface, a second surface and a third surface, wherein the first surface is opposite to the second surface, and the third surface is connected between the first surface and the second surface;
   a first patterned conductive layer, disposed on the first surface;
   a second patterned conductive layer, disposed on the second surface; and
   a three-dimensional (3D) printing conductive wire, disposed on the third surface and connected between the first patterned conductive layer and the second patterned conductive layer.

2. The package substrate according to claim 1, wherein the third surface comprises a surface of an opening in the carrier, a side surface of an edge of the carrier or a surface of at least one notch of the edge of the carrier.

3. The package substrate according to claim 1, further comprising:
   a first solder resist layer, covering the first patterned conductive layer and exposing a portion of the first patterned conductive layer.

4. The package substrate according to claim 3, further comprising:
   a second solder resist layer, covering the second patterned conductive layer and exposing a portion of the second patterned conductive layer.

5. The package substrate according to claim 3, further comprising:
   a third solder resist layer, covering the 3D-printing conductive wire.

6. A package, comprising:
   a package substrate, comprising:
      a carrier, having a first surface, a second surface and a third surface, wherein the first surface is opposite to the second surface, and the third surface is connected between the first surface and the second surface;
      a first patterned conductive layer, disposed on the first surface;
      a second patterned conductive layer, disposed on the second surface; and
      a 3D-printing conductive wire, disposed on the third surface and connected between the first patterned conductive layer and the second patterned conductive layer; and
   a first electronic device, disposed on the first surface and electrically connected with the first patterned conductive layer.

7. The package according to claim 6, wherein the third surface comprises a surface of an opening in the carrier, a side surface of an edge of the carrier or a surface of at least one notch of the edge of the carrier.

8. The package according to claim 6, further comprising:
   a second electronic device, disposed on the second surface and electrically connected with the second patterned conductive layer.

9. The package according to claim 8, wherein the carrier has an opening, and the opening exposes the second electronic device disposed on the second surface.

10. The package according to claim 9, further comprising:
    a light-transmitting plate, disposed on the first surface and covering the opening.

* * * * *